United States Patent
Tatsumi

(10) Patent No.: US 7,456,447 B2
(45) Date of Patent: Nov. 25, 2008

(54) SEMICONDUCTOR INTEGRATED CIRCUIT DEVICE

(75) Inventor: Kyoka Tatsumi, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 218 days.

(21) Appl. No.: 11/487,432

(22) Filed: Jul. 17, 2006

(65) Prior Publication Data
US 2007/0033548 A1 Feb. 8, 2007

(30) Foreign Application Priority Data
Aug. 5, 2005 (JP) ............................. 2005-228069

(51) Int. Cl.
*H01L 27/10* (2006.01)
(52) U.S. Cl. ............... 257/207; 257/210; 257/E23.151; 257/E27.026; 326/41
(58) Field of Classification Search ................ 257/207, 257/210, 211, 503, E23.079, E23.151, E27.026; 326/41, 45
See application file for complete search history.

(56) References Cited
U.S. PATENT DOCUMENTS
6,489,689 B2 * 12/2002 Nojiri ......................... 257/786

FOREIGN PATENT DOCUMENTS
JP 2001-148464 5/2001

* cited by examiner

*Primary Examiner*—Quoc D Hoang
(74) *Attorney, Agent, or Firm*—McGinn IP Law Group, PLLC

(57) ABSTRACT

In a semiconductor integrated circuit device, a VDD wiring trace and a GND wiring trace are routed along an N-well and a P-well, respectively, within a substrate. A substrate-bias VDD2 wiring trace is routed in a direction that intersects the VDD wiring trace and GND wiring trace in the same layer thereof and is electrically connected thereto. A P+ diffusion layer is disposed in the N-well in the vicinity of a portion where the wiring directions of the VDD wiring trace and substrate-bias VDD2 wiring trace intersect and is electrically connected to the VDD wiring trace via a contact. An N+ diffusion layer is disposed in the P-well in the vicinity of a portion where the wiring directions of the GND wiring trace and substrate-bias VDD2 wiring trace intersect and is electrically connected to the GND wiring trace via a contact. The P+ diffusion layer is used as a wiring route regarding the VDD wiring trace and the N+ diffusion layer is used as a wiring route regarding the GND wiring trace.

17 Claims, 19 Drawing Sheets

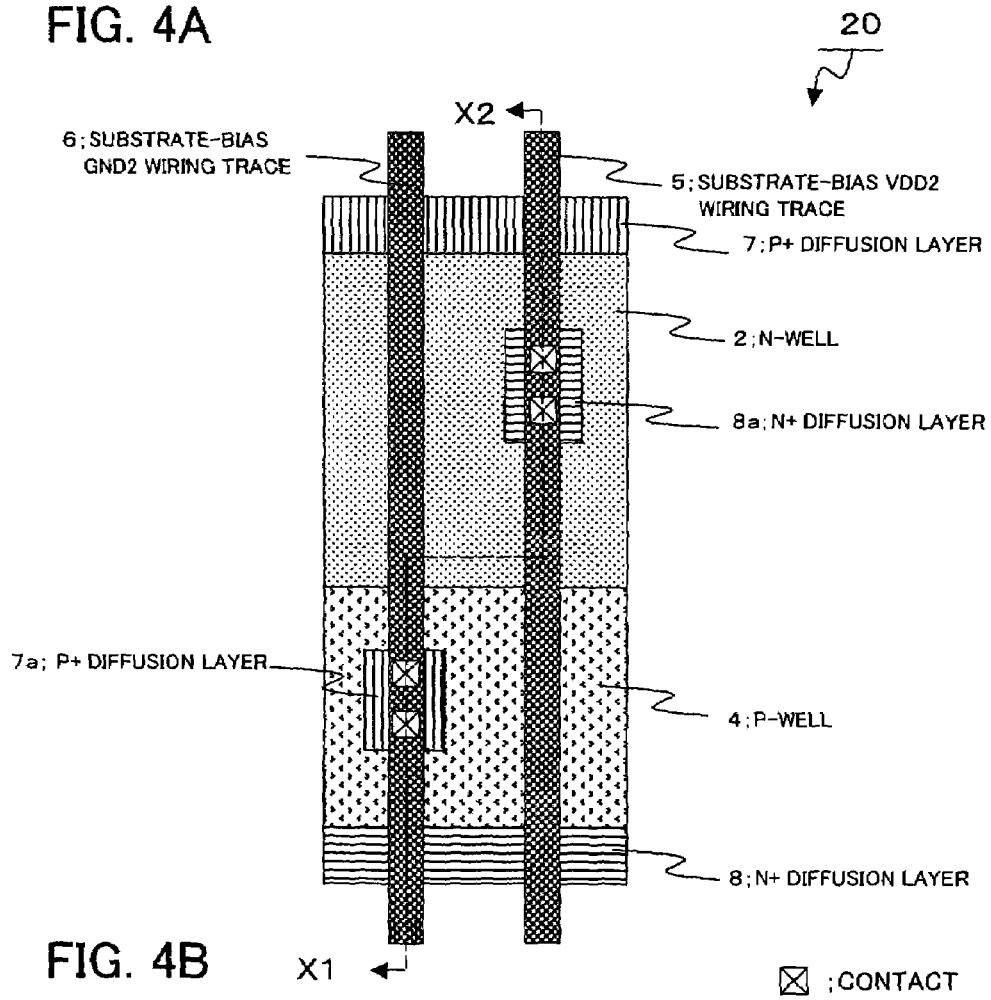
FIG. 4A
FIG. 4B
X1–X2
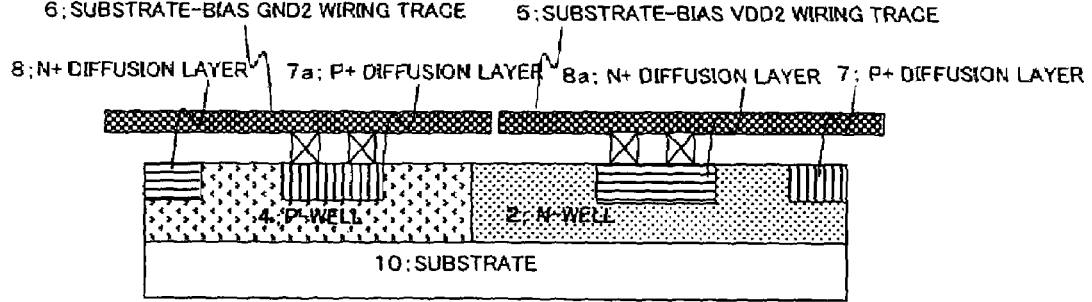

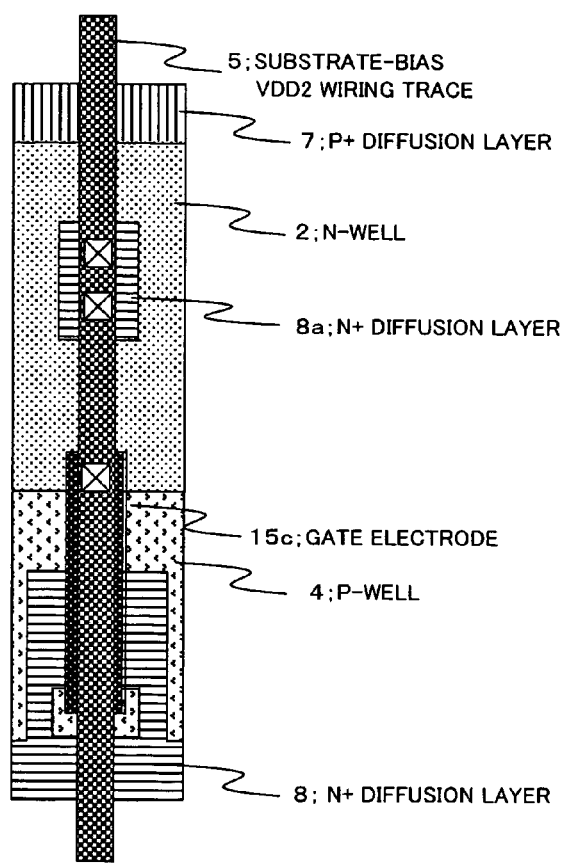
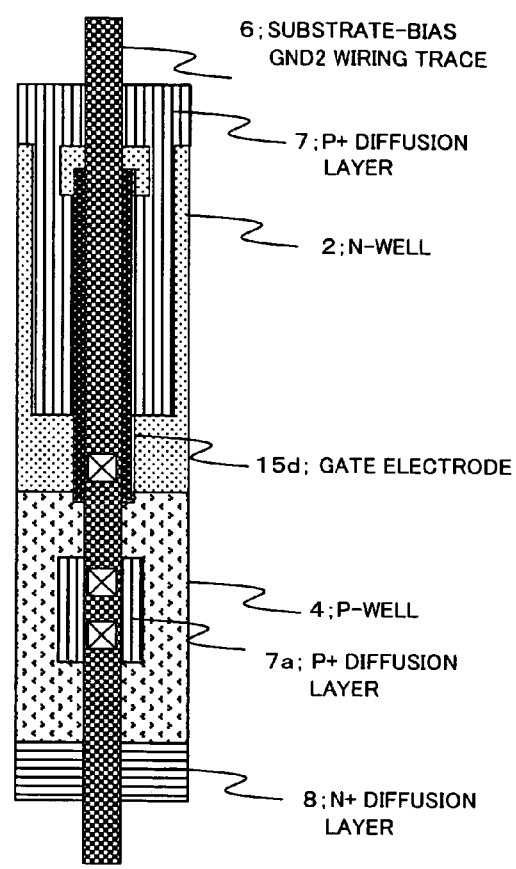

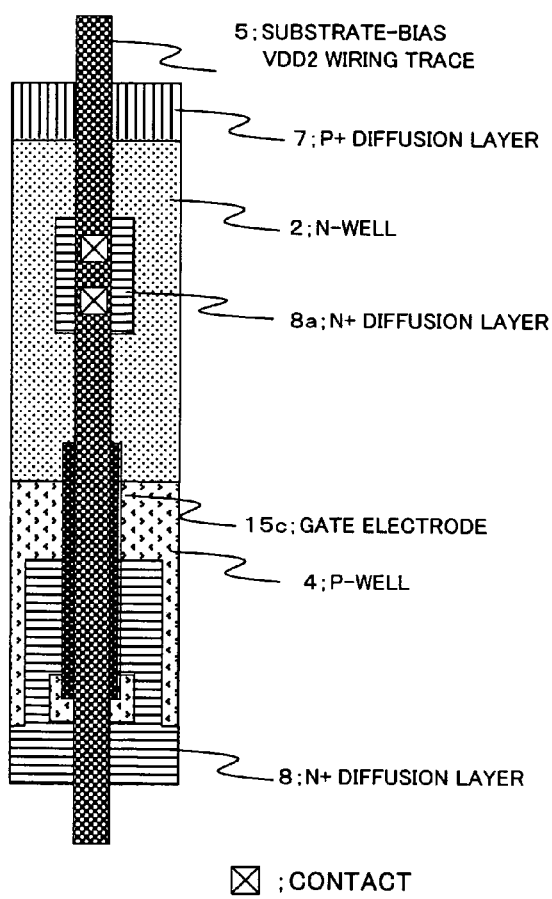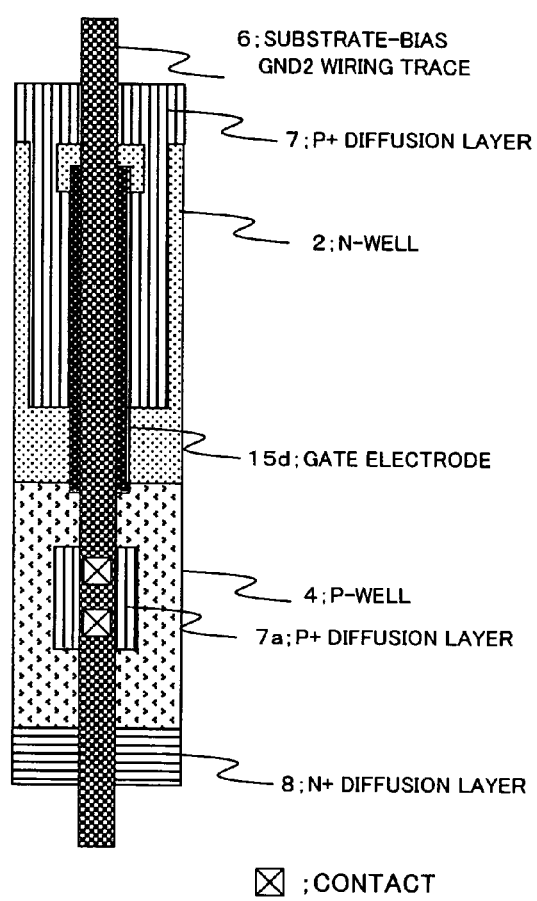

30b  20g  30a  20h  30a

X1—X2

US 7,456,447 B2

SEMICONDUCTOR INTEGRATED CIRCUIT DEVICE

FIELD OF THE INVENTION

This invention relates to a semiconductor integrated circuit device and, more particularly, to a semiconductor integrated circuit device having wiring for supplying a substrate bias that controls substrate potential.

BACKGROUND OF THE INVENTION

LSI chips used in recent mobile devices such as mobile terminals are required to execute high-speed processing and to consume little power. These requirements generally are mutually contradictory; if frequency is raised to execute high-speed processing, heat is evolved and power consumption increases. In order to deal with these mutually contradictory requirements, a "substrate biasing technique" has been adopted. This involves applying a potential, which is different from that of a transistor source, to the substrate and controlling substrate potential to thereby reduce leakage when the transistor is cut off. In order to control substrate bias with this substrate biasing technique, a substrate potential for control is separately required in addition to the usual power-supply potential.

An example of a semiconductor integrated circuit device having wiring for supplying a substrate bias that controls substrate potential is disclosed in the specification of Japanese Patent Kokai Publication No. JP-P2001-148464A (see FIG. 1 thereof). This semiconductor integrated circuit device has the structure shown in FIG. 19. Power-supply voltage VDD lines (VDD) 101 and ground voltage VSS lines (GND) 102 are wired alternatingly as a first wiring layer on a semiconductor substrate at regular intervals along the horizontal direction in FIG. 19. Logic cells CA are arranged along the horizontal direction between the power-supply voltage VDD lines 101 and ground voltage VSS lines 102.

A P-channel transistor that operates upon being supplied with power-supply voltage VDD is formed in an area 105 that includes the power-supply voltage VDD line 101 in each logic cell CA. An N-channel transistor that operates upon being supplied with ground voltage VSS is formed in an area 106 that includes the ground voltage VSS line 102 in each logic cell CA.

Furthermore, an n-type substrate potential NSUB line 111 and a p-type substrate potential PSUB line 112, which constitute a pair, are formed as a second wiring layer in the vertical direction in FIG. 19 at right angles to the power-supply voltage VDD lines 101 and ground voltage (VSS) lines 102. Substrate-potential supply cells VSC are placed in the areas in which the logic cells CA are placed. The substrate-potential supply cells VSC are disposed one after another in the vertical direction along the n-type substrate potential NSUB line 111 and p-type substrate potential PSUB line 112, and are supplied with an n-type substrate potential NSUB and a p-type substrate potential PSUB from the n-type substrate potential NSUB line 111 and p-type substrate potential PSUB line 112, respectively. The substrate-potential supply cells VSC apply these potentials to N- and P-type substrates, respectively. Adopting such a structure improves area efficiency.

[Patent Document 1] JP Patent Kokai Publication No. JP-P2001-148464A (FIG. 1)

SUMMARY OF THE DISCLOSURE

Modern semiconductor integrated circuit devices exhibit a much higher degree of integration and a much greater number of wiring traces. As a result, if a chip of large size is required, this leads directly to a rise in cost. In particular, as the power wiring often involves wiring of large width, the method of routing the power wiring has a major influence upon the increase in degree of integration of the semiconductor integrated circuit device.

In the semiconductor integrated circuit device shown in FIG. 19, the power-supply voltage VDD lines (VDD) 101 and ground voltage VSS lines (GND) 102 are wired in the first wiring layer, and the n-type substrate potential NSUB line 111 and p-type substrate potential PSUB line 112 are wired in the second wiring layer. Generally, in order to assure layout position precision for the wiring of the upper layer, it is necessary to enlarge via diameter or wiring width in the upper wiring layer. Accordingly, if the second wiring layer is made a layer above the first wiring layer (i.e., if it is situated farther from the substrate) in the above-described example, then the degree of integration cannot be raised sufficiently because the wiring will be performed in two layers, namely the first wiring layer and the second wiring layer, which may have a wiring density lower than that of the first wiring layer.

Accordingly, there is much to be desired in the art.

According to a first aspect of the present invention, there is provided a semiconductor integrated circuit device comprising: a first wiring trace routed along a well of a first conductivity type in a substrate; a second wiring trace routed along a well of a second conductivity type in the substrate; a third wiring trace disposed in the same layer as the first and second wiring traces, routed in a direction that intersects the first and second wiring traces and electrically insulated from the first and second wiring traces; a first diffusion layer of the second conductivity type disposed in the well of the first conductivity type in the vicinity of a portion where the wiring directions of the first and third wiring traces intersect, and electrically connected to the first wiring trace through a contact; and a second diffusion layer of the first conductivity type disposed in the well of the second conductivity type in the vicinity of a portion where the wiring directions of the second and third wiring traces intersect, and electrically connected to the second wiring trace through a contact. The first diffusion layer is used as a wiring route regarding the first wiring trace, and the second diffusion layer is used as a wiring route regarding the second wiring trace.

According to a second aspect of the present invention, there is provided a semiconductor integrated circuit device that includes cell placement areas in which a plurality of standard cells are placed on a semiconductor substrate. The device comprises: a first power-supply line for supplying a first power-supply potential to a standard cell; a second power-supply line, which is routed parallel to the first power-supply line, for supplying a second power-supply potential to the standard cells; a third power-supply line, which is routed in a direction that intersects the first power-supply line, for supplying a third power-supply potential to a well of a first conductivity type in the cell placement areas; a fourth power-supply line, which is routed parallel to the third power-supply line, for supplying a fourth power-supply potential to a well of a second conductivity type in the cell placement areas; first and second substrate-bias supply cells disposed in the cell placement areas; a first diffusion layer of the second conductivity type disposed in the well of the first conductivity type and electrically connected to the first power-supply line through a contact; and a second diffusion layer of the first conductivity type disposed in the well of the second conductivity type and electrically connected to the second power-supply line through a contact.

The first, second, third and fourth power-supply lines are formed in a first metal wiring layer of the semiconductor integrated circuit device; the first substrate-bias supply cell includes the third power-supply line, a first well contact connected to the third power-supply line for supplying the third power-supply potential to the well of the first conductivity type, the first diffusion layer and the second diffusion layer. Furthermore, the second substrate-bias supply cell includes the fourth power-supply line, a second well contact connected to the fourth power-supply line for supplying the fourth power-supply potential to the well of the second conductivity type, the first diffusion layer and the second diffusion layer. Furthermore, in the first and second substrate bias supply cells, the first diffusion layer is used as a wiring route regarding the first power-supply line and the second diffusion layer is used as a wiring route regarding the second power-supply line.

The meritorious effects of the present invention are summarized as follows.

In accordance with the present invention, a VDD power-supply line, GND ground line, substrate-bias VDD2 power-supply line and substrate-bias GND2 ground line are disposed in the same wiring layer and the wiring layer is the closest to the substrate. As a result, the degree of integration of the semiconductor integrated circuit device can be raised.

BRIEF DESCRIPTION OF THE DRAWINGS

FIGS. 4A and 4B are plan and sectional views, respectively, illustrating the structure of a substrate-bias supply cell according to the first embodiment;

FIGS. 7A and 7B are plan views illustrating the structure of a substrate-bias supply cell according to a third embodiment of the present invention;

FIGS. 9A and 9B are plan views illustrating the structure of a substrate-bias supply cell according to a fourth embodiment of the present invention;

PREFERRED EMBODIMENTS OF THE INVENTION

Preferred embodiments of the present invention will now be described in detail with reference to the accompanying drawings.

Figures 1A, 1B:
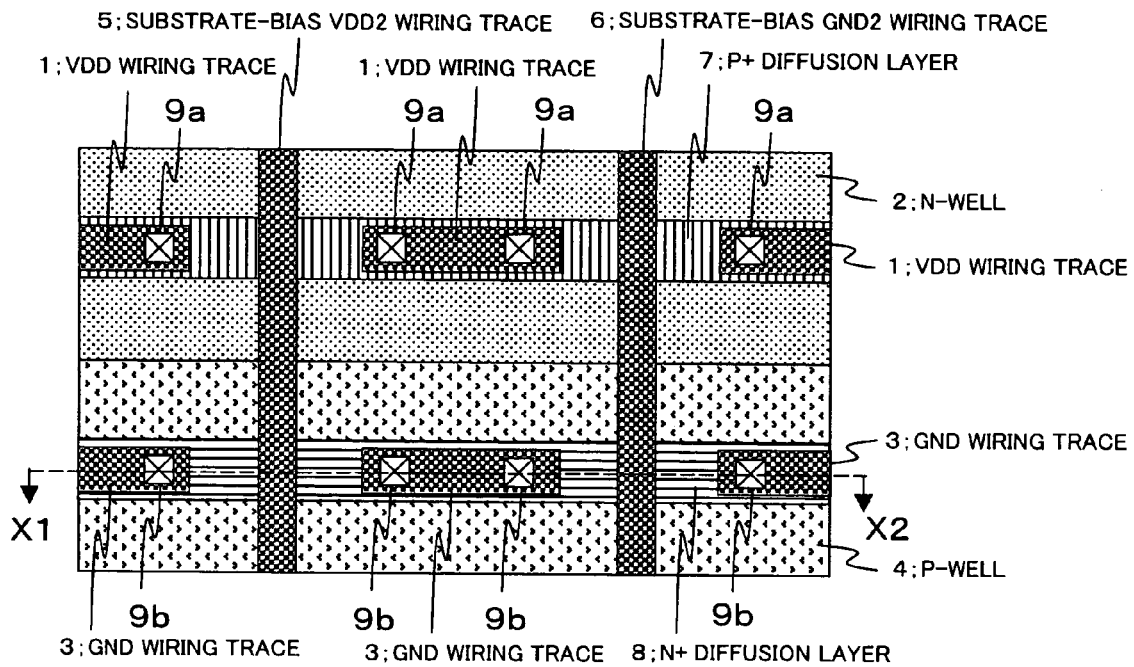
FIGS. 1A and 1B are plan and sectional views, respectively, illustrating the wiring structure of a semiconductor integrated circuit device embodying the present invention.

FIG. 1A is a plan view illustrating the wiring structure of a semiconductor integrated circuit device embodying the present invention, and FIG. 1B is a sectional view taken along line X1-X2 in FIG. 1A. A VDD wiring trace 1 is routed along an N-well 2 in a substrate 10, and a GND (ground) wiring trace 3 is routed along a P-well 4 in the substrate 10. A substrate-bias VDD2 wiring trace 5 is placed in the same layer as that of the VDD wiring trace 1 and GND wiring trace 3 and in a direction that intersects the VDD wiring trace 1 and GND wiring trace 3, and is electrically insulted from the VDD wiring trace 1 and GND wiring trace 3. A substrate-bias GND2 wiring trace 6 is placed in the same layer as that of the VDD wiring trace 1 and GND wiring trace 3 and in a direction that intersects the VDD wiring trace 1 and GND wiring trace 3, and is electrically insulted from the VDD wiring trace 1 and GND wiring trace 3 and spaced a prescribed distance away from the substrate-bias VDD2 wiring trace 5. The substrate-bias VDD2 wiring trace 5 and substrate-bias GND2 wiring trace 6 are insulated from the N-well 2 and P-well 4 by placing an interlayer insulating film 11 between these wiring traces and the N-well 2 and P-well 4.

A P+ diffusion layer 7 is placed in the N-well 2 at least in the vicinity of the portion where the routing directions of the VDD wiring trace 1 and substrate-bias VDD2 wiring trace 5 intersect and at least in the vicinity of the portion where the routing directions of the VDD wiring trace 1 and substrate-bias GND2 wiring trace 6 intersect, and is electrically connected to the VDD wiring trace 1 via contacts 9a. The P+ diffusion layer 7 is used as a wiring route in relation to the VDD wiring trace 1. Further, an N+ diffusion layer 8 is placed in the P-well 4 at least in the vicinity of the portion where the routing directions of the GND wiring trace 3 and substrate-bias VDD2 wiring trace 5 intersect and at least in the vicinity of the portion where the routing directions of the GND wiring trace 3 and substrate-bias GND2 wiring trace 6 intersect, and is electrically connected to the GND wiring trace 3 via contacts 9b. The N+ diffusion layer 8 is used as a wiring route in relation to the GND wiring trace 3.

In the semiconductor integrated circuit device having the structure set forth above, the VDD wiring trace 1, GND wiring trace 3, substrate-bias VDD2 wiring trace 5 and substrate-bias GND2 wiring trace 6 are placed in the same metal layer that is closest to the substrate. Since wiring traces routed in two layers in the prior art are routed in a single layer closest to the substrate in the semiconductor integrated circuit device of the present invention, the degree of integration of the device is raised over that of the prior art.

The present invention will now be described in accordance with embodiments in which a cell-based semiconductor integrated circuit device is taken as an example.

First Embodiment

Figure 2:
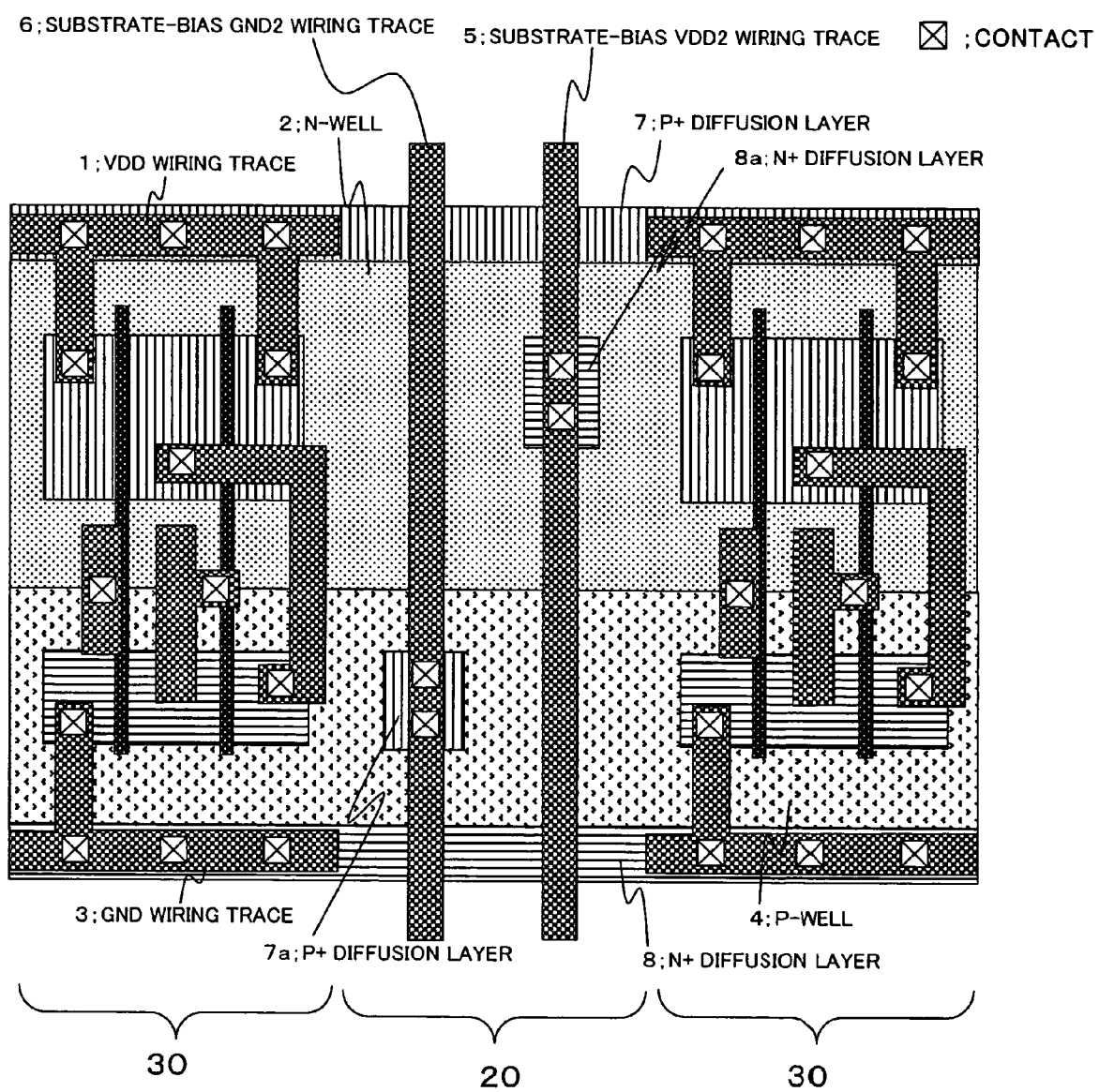
FIG. 2 is a plan view illustrating the partial structure of a semiconductor integrated circuit device according to a first embodiment of the present invention.

FIG. 2 is a plan view illustrating the partial structure of a semiconductor integrated circuit device according to a first embodiment of the present invention. As shown in FIG. 2, the semiconductor integrated circuit device has a substrate-bias supply cell 20 and standard cells 30 arranged in a row in the horizontal direction in FIG. 2 astride the N-well 2 and P-well 4. Among the multiplicity of cells that exist in the semiconductor integrated circuit device, two standard cells 30 and the substrate-bias supply cell 20 bracketed by the standard cells 30 are illustrated. In the semiconductor integrated circuit device thus constructed, the VDD wiring trace 1, GND wiring trace 3, substrate-bias VDD2 wiring trace 5 and substrate-bias GND2 wiring trace 6 are routed in the same metal layer, the substrate-bias VDD2 wiring trace 5 and substrate-bias GND2 wiring trace 6 are routed in the vertical direction in the substrate-bias supply cell 20, and the VDD wiring trace 1 and GND wiring trace 3 are routed in the horizontal direction in each of the standard cells 30. In the substrate-bias supply cell 20, in which the VDD wiring trace 1 and GND wiring trace 3 are not routed, the P+ diffusion layer 7 is used as a wiring route in relation to the VDD wiring trace 1, and the N+ diffusion layer 8 is used as a wiring route in relation to the GND wiring trace 3.

Figure 3A:
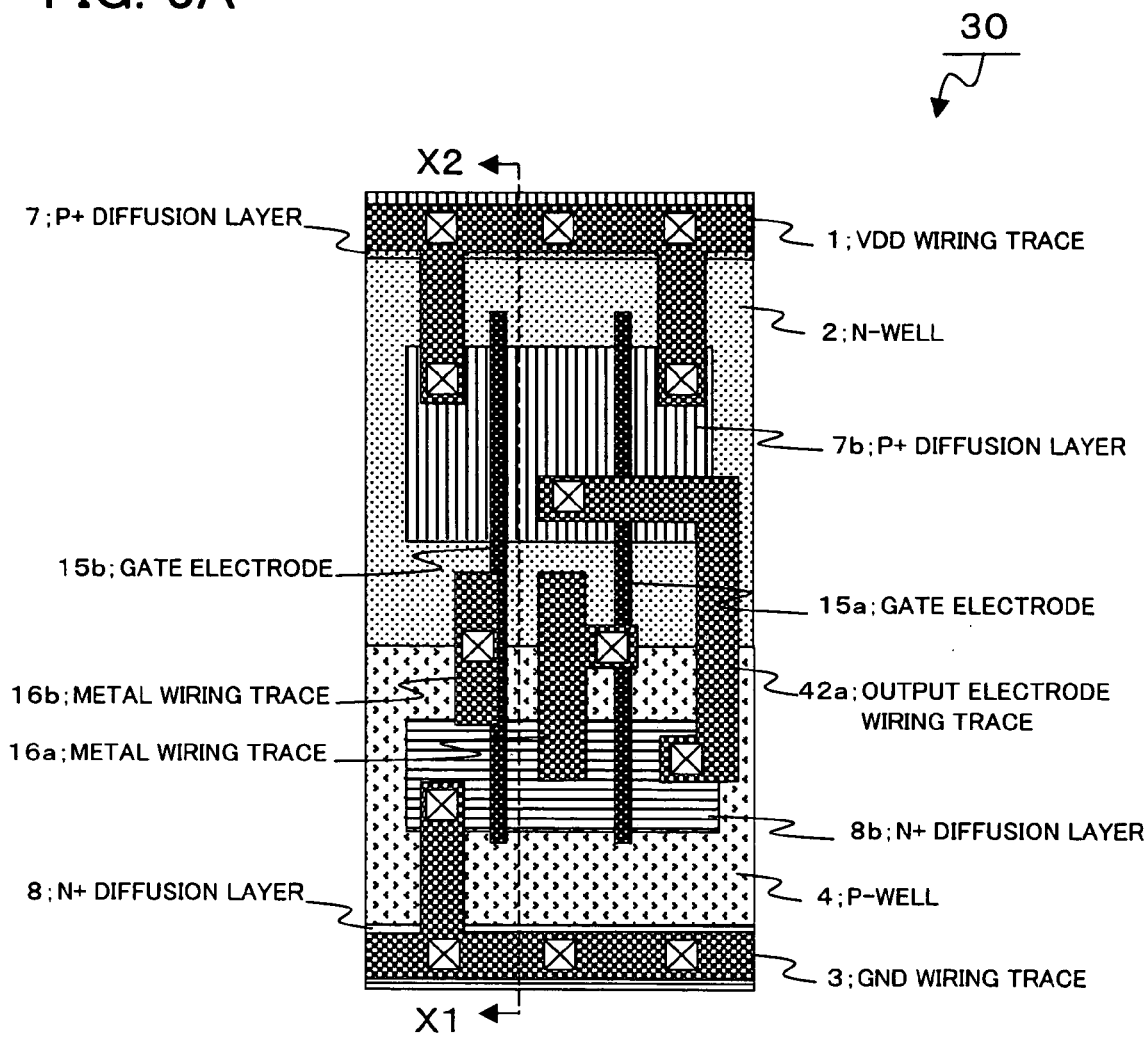
FIGS. 3A and 3B are plan and sectional views, respectively, illustrating the structure of a standard cell.
Figure 3B:
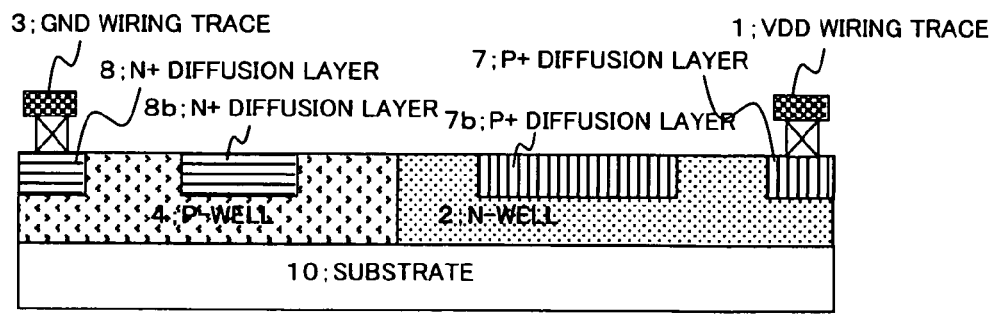

FIG. 3A is plan view illustrating the structure of the standard cell 30, and FIG. 3B is a sectional view taken along line X1-X2 in FIG. 3A. As shown in FIGS. 3A and 3B, the standard cell 30 is one that constitutes a 2-input NAND gate and exists in a structure in which the N-well 2 and P-well 4 are formed on a semiconductor substrate. Further, P+ diffusion layers 7, 7b are formed in the N-well 2, and N+ diffusion layers 8, 8b are formed in the P-well 4. A gate electrode 15a of polysilicon or the like connected to a metal wiring trace 16a via an insulating layer and a gate electrode 15b of polysilicon or the like connected to a metal wiring trace 16b via an insulating layer exist on the P+ diffusion layer 7b and N+ diffusion layer 8b. The metal wiring trace 16a and metal wiring trace 16b are the input terminals of the 2-input NAND gate. Part of the VDD wiring trace 1 routed on the P+ diffusion layer 7 via contacts is extended over the P+ diffusion layer 7b and is connected to the left and right ends of the P+ diffusion layer 7b via contacts. Part of the GND wiring trace 3 routed on the N+ diffusion layer 8 via contacts is extended over the P+ diffusion layer 8b and is connected to the left end of the P+ diffusion layer 8b via a contact. The central portion of the P+ diffusion layer 7b bracketed by the gate electrodes 15a and 15b and the right end of the N+ diffusion layer 8b are connected by an output electrode trace 42a, which forms the output terminal of the 2-input NAND gate.

It goes without saying that although the standard cell 30 is used as the standard cell in the embodiment set forth below, the invention is not limited to such a standard cell.

FIG. 4A is a plan view illustrating the structure of the substrate-bias supply cell 20, and FIG. 4B is a sectional view taken along line X1-X2 in FIG. 4A. The substrate-bias supply cell 20 in FIGS. 4A and 4B applies a bias voltage to the N-well 2 and P-well 4 and exists in a structure in which the N-well 2 and P-well 4 are formed in the semiconductor substrate. The P+ diffusion layer 7 similar to that of the standard cell 30 is formed in the N-well 2, and the N+ diffusion layer 8 similar to that of the standard cell 30 is formed in the P-well 4. An N+ diffusion layer 8a connected from the substrate-bias VDD2 wiring trace 5 via contacts is formed in the N-well 2, and a P+ diffusion layer 7a connected from the substrate-bias GND2 wiring trace 6 via contacts is formed in the P-well 4.

The power supply of a PMOS-transistor substrate bias, which can exceed the power-supply voltage supplied to the VDD wiring trace 1, is supplied from the substrate-bias VDD2 wiring trace 5 to the N+ diffusion region 8a via a contact. This power is applied to the N-well 2. Impressing a voltage (a forward substrate bias) lower than the voltage of the VDD wiring trace 1 upon the substrate-bias VDD2 wiring trace 5 makes it easier to pass current through the channel of the transistor constructed in the P+ diffusion layer 7a. On the other hand, making the potential of the substrate-bias VDD2 wiring trace 5 higher than that of the VDD wiring trace 1 applies a reverse substrate bias to the N-well 2 and reduces leakage of current when the transistor is non-operational.

The power supply of an NMOS-transistor substrate bias, which can fall below the ground voltage supplied to the GND wiring trace 3, is supplied from the substrate-bias GND2 wiring trace 6 to the P+ diffusion region 7a via contact. This power is applied to the P-well 4. Placing the substrate-bias GND2 wiring trace 6 and the GND wiring trace 3 at the same potential applies substrate bias in the forward direction and makes it easier to pass current through the channel of the transistor when the transistor constructed in the N+ diffusion region 8a operates. On the other hand, making the potential of the substrate-bias GND2 wiring trace 6 lower than that of the GND wiring trace 3 applies substrate bias to the P-well 4 and reduces leakage of current when the transistor is non-operational.

Thus, in the semiconductor integrated circuit device illustrated in FIGS. 2A and 2B, the substrate-bias supply cell 20 is interposed between the two standard cells 30 and the VDD wiring trace 1, GND wiring trace 3, substrate-bias VDD2 wiring trace 5 and substrate-bias GND2 wiring trace 6 are routed in the same metal layer closest to the substrate. This raises the degree of integration of the semiconductor integrated circuit device.

Second Embodiment

Figure 5A:
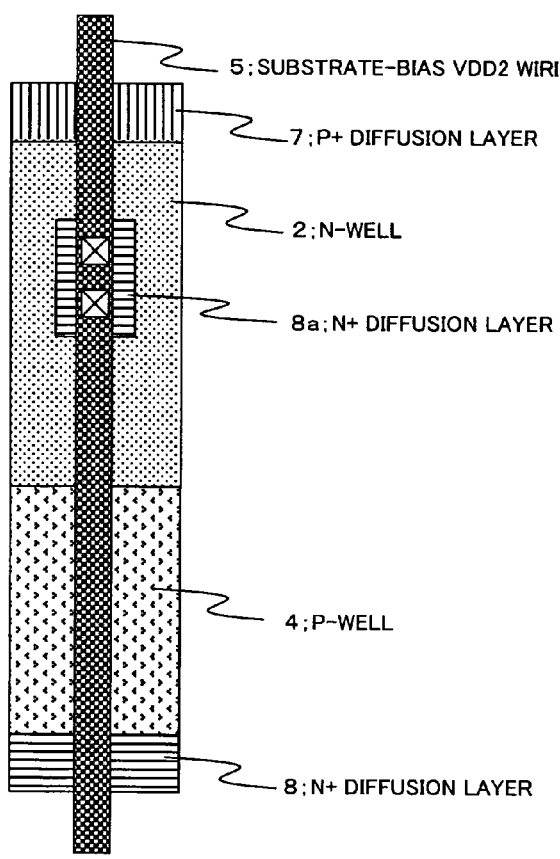
FIGS. 5A and 5B are plan views illustrating the structure of a substrate-bias supply cell according to a second embodiment of the present invention.
Figure 5B:
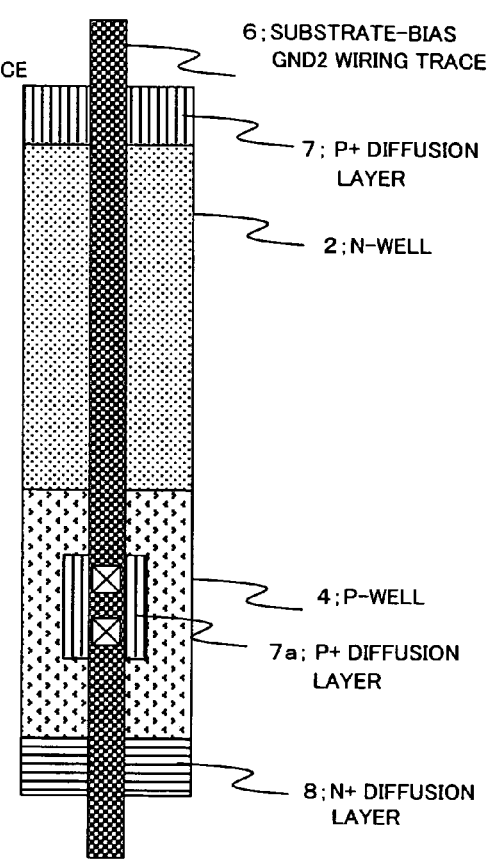

FIGS. 5A and 5B are plan views illustrating the structures of substrate-bias supply cells according to a second embodiment of the present invention, in which FIG. 5A is a plan view of a substrate-bias supply cell 20a for supplying the substrate-bias VDD2 power-supply potential and FIG. 5B a plan view of a substrate-bias supply cell 20b for supplying the substrate-bias GND2 ground potential. The substrate-bias supply cell 20a of FIG. 5A has a structure similar to that of the right half of the substrate-bias supply cell 20 shown in FIGS. 4A and 4B, and the substrate-bias supply cell 20b of FIG. 5B has a structure similar to that of the left half of the substrate-bias supply cell 20 shown in FIGS. 4A and 4B.

More specifically, the substrate-bias supply cell 20a in FIG. 5A applies bias voltage to the N-well 2 and exists in a structure in which the N-well 2 and P-well 4 are formed on the semiconductor substrate. The P+ diffusion layer 7 similar to that of the standard cell 30 of FIGS. 3A and 3B is formed in the N-well 2, and the N+ diffusion layer 8 similar to that of the standard cell 30 is formed in the P-well 4. An N+ diffusion layer 8a connected from the substrate-bias VDD2 wiring trace 5 via contacts is formed in the N-well 2.

The substrate-bias supply cell 20b in FIG. 5B applies bias voltage to the P-well 4 and exists in a structure in which the N-well 2 and P-well 4 are formed on the semiconductor substrate. The P+ diffusion layer 7 similar to that of the standard cell 30 is formed in the N-well 2, and the N+ diffusion layer 8 similar to that of the standard cell 30 is formed in the P-well 4. A P+ diffusion layer 7a connected from the substrate-bias GND2 wiring trace 6 via contacts is formed in the P-well 4.

Figure 6:
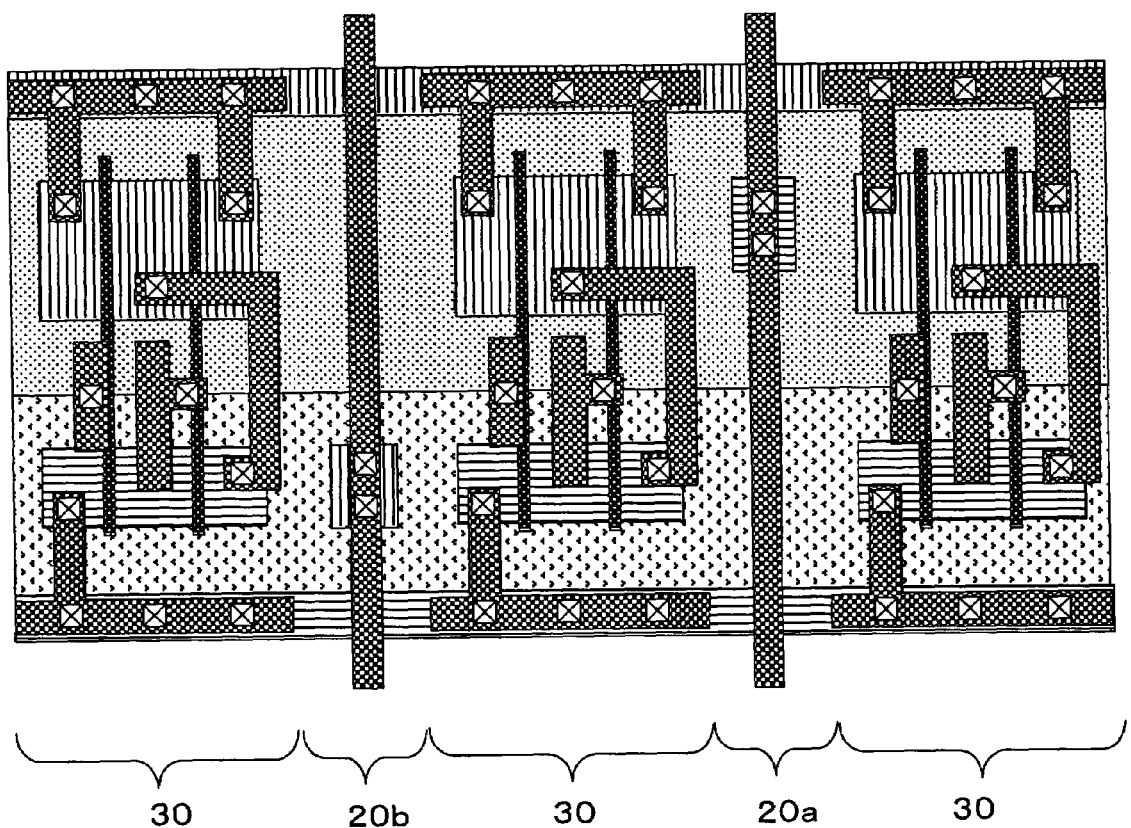
FIG. 6 is a plan view illustrating the partial structure of a semiconductor integrated circuit device according to the second embodiment.

FIG. 6 is a plan view illustrating the partial structure of the semiconductor integrated circuit device according to the second embodiment. The semiconductor integrated circuit device in FIG. 6 has the substrate-bias supply cells 20a, 20b and the standard cells 30 arranged in a row in the horizontal direction in FIG. 6 astride the N-well 2 and P-well 4. Among the multiplicity of cells that exist in the semiconductor integrated circuit device in FIG. 6, three standard cells 30, the substrate-bias supply cell 20a bracketed by the two standard cells 30 at the left and center, and the substrate-bias supply cell 20b bracketed by the two standard cells 30 at the right and center are illustrated. In the semiconductor integrated circuit device thus constructed, the VDD wiring trace 1, GND wiring trace 3, substrate-bias VDD2 wiring trace 5 and substrate-bias GND2 wiring trace 6 are routed in the same metal layer, the substrate-bias VDD2 wiring trace 5 is routed in the vertical direction in the substrate-bias supply cell 20a, the substrate-bias GND2 wiring trace 6 is routed in the vertical direction in the substrate-bias supply cell 20b, and the VDD wiring trace 1 and GND wiring trace 3 are routed in the horizontal direction in each of the standard cells 30. In the substrate-bias supply cells 20a, 20b, in which the VDD wiring trace 1 and GND wiring trace 3 are not routed, the P+ diffusion layer 7 is used as a wiring route in relation to the VDD wiring trace 1, and the N+ diffusion layer 8 is used as a wiring route in relation to the GND wiring trace 3.

If it is desired to strengthen the substrate bias of the N-well 2, for example, in the semiconductor integrated circuit device having this structure, it will suffice to place many of the substrate-bias supply cells 20a of FIG. 5A in the semiconductor integrated circuit device, and the substrate-bias GND2 wiring traces 6 need not be increased more than necessary in comparison with the first embodiment. In the semiconductor integrated circuit device of the second embodiment, the substrate-bias supply cell 20 shown in FIGS. 4A and 4B, which in the above embodiment was constituted by the substrate-bias VDD2 wiring trace 5 and substrate-bias GND2 wiring trace 6 forming a pair, is separated into the substrate-bias supply cell 20a for supplying the power of the substrate-bias VDD2 and the substrate-bias supply cell 20b for supplying the ground of the substrate-bias GND2. As a result, each of the substrate-bias supply cells can be disposed freely in terms of position and number as necessary and the wiring resources of the substrate can be utilized even more effectively.

It should be noted that it is possible to attain an arrangement exactly the same as that of the substrate-bias supply cell 20 of the first embodiment by placing the substrate-bias supply cells 20a, 20b of the second embodiment side by side.

Third Embodiment

FIGS. 7A and 7B are plan views illustrating the structures of substrate-bias supply cells according to a third embodiment of the present invention, in which FIG. 7A is a plan view of a substrate-bias supply cell 20c for supplying the substrate-bias VDD2 power-supply potential and FIG. 7B a plan view of a substrate-bias supply cell 20d for supplying the substrate-bias GND2 ground potential. The substrate-bias supply cell 20c of FIG. 7A further constructs a transistor on the P-well 4 in comparison with the substrate-bias supply cell 20a illustrated in FIG. 5A, and the substrate-bias supply cell 20d of FIG. 7B further constructs a transistor on the N-well 2 in comparison with the substrate-bias supply cell 20b illustrated in FIG. 5B.

More specifically, the substrate-bias supply cell 20c in FIG. 7A is such that part of the N+ diffusion layer 8 formed in the P-well 4 branches in a U-shaped configuration toward the N-well 2 and a gate electrode 15c is disposed on the N+ diffusion layer 8 laterally of the branching portion, thereby forming a transistor structure. The gate electrode 15c and substrate-bias VDD2 wiring trace 5 are connected by a contact. The gate capacitance of the transistor in the substrate-bias supply cell 20c having this structure functions to reduce a fluctuation in potential ascribable to IR-Drop, etc., with respect to the area of the P-well 4.

The substrate-bias supply cell 20d in FIG. 7B is such that part of the P+ diffusion layer 7 formed in the N-well 2 branches in a U-shaped configuration toward the P-well 4 and a gate electrode 15d is disposed on the P+ diffusion layer 7 in the horizontal direction of the branching portion, thereby forming a transistor structure. The gate electrode 15d and substrate-bias GND2 wiring trace 6 are connected by a contact. The gate capacitance of the transistor in the substrate-bias supply cell 20d having this structure functions to reduce a fluctuation in potential ascribable to IR-Drop, etc., with respect to the area of the N-well 2.

Figure 8:
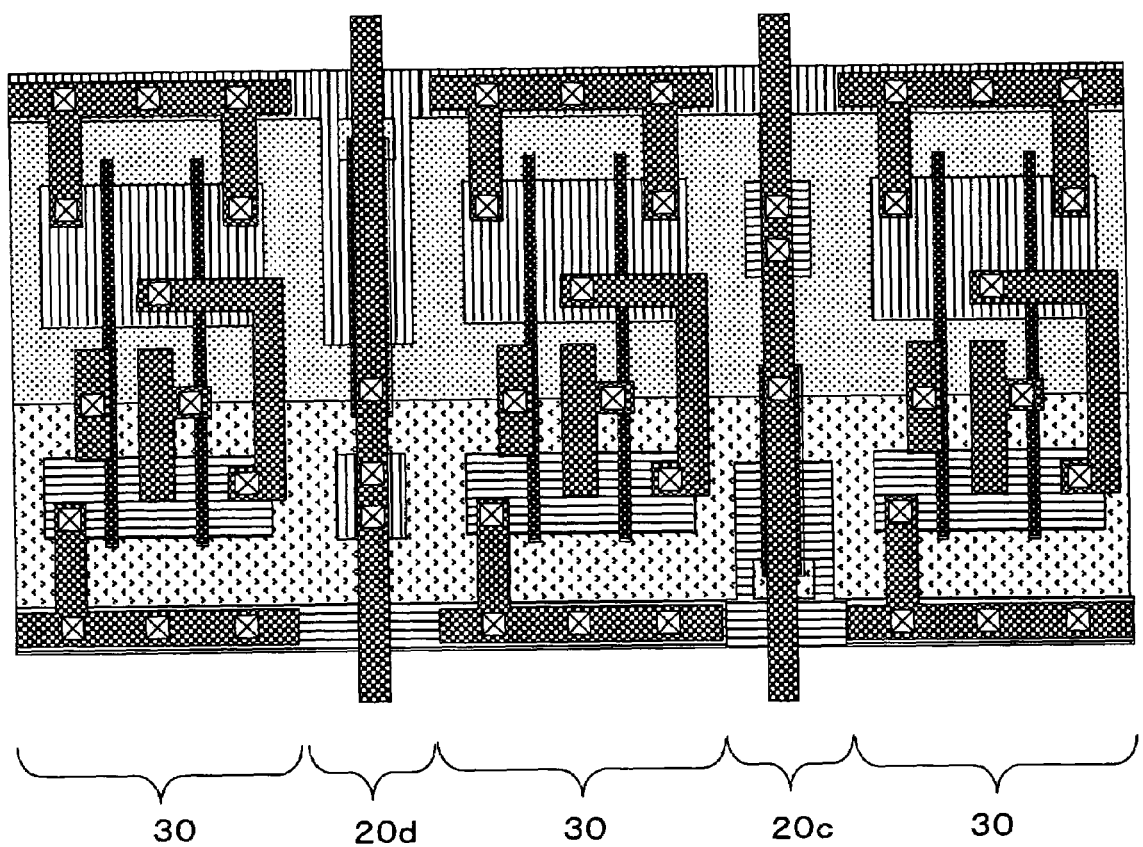
FIG. 8 is a plan view illustrating the partial structure of a semiconductor integrated circuit device according to the third embodiment.

FIG. 8 is a plan view illustrating the partial structure of the semiconductor integrated circuit device according to the third embodiment. The semiconductor integrated circuit device in FIG. 8 has the substrate-bias supply cells 20c, 20d and the standard cells 30 arranged in a row in the horizontal direction in FIG. 8 astride the N-well 2 and P-well 4. In the semiconductor integrated circuit device of FIG. 8, the substrate-bias supply cells 20c, 20d are substituted for the substrate-bias supply cells 20a, 20b, respectively, in FIG. 6. The semiconductor integrated circuit device thus constructed has effects similar to those of the second embodiment and, owing to formation of the capacitance elements by the transistor gate, makes it possible to reduce a fluctuation in potential ascribable to IR-Drop or the like.

Fourth Embodiment

FIGS. 9A and 9B are plan views illustrating the structures of substrate-bias supply cells according to a fourth embodiment of the present invention, in which FIG. 9A is a plan view of a substrate-bias supply cell 20e for supplying the substrate-bias VDD2 power-supply potential and FIG. 9B a plan view of a substrate-bias supply cell 20f for supplying the substrate-bias GND2 ground potential. The substrate-bias supply cell 20e of FIG. 9A has a structure in which the contact between the gate electrode 15c and the substrate-bias VDD2 wiring trace 5 is eliminated, as compared with the substrate-bias supply cell 20c of FIG. 7A. Further, the substrate-bias supply cell 20f of FIG. 9B has a structure in which the contact between the gate electrode 15d and the substrate-bias GND2 wiring trace 6 wiring trace 5 is eliminated, as compared with the substrate-bias supply cell 20d of FIG. 9B.

The substrate-bias supply cells 20e, 20f thus constructed possess a structure in which the gate contact of the transistors has been eliminated. As a result, the possibility that a leakage current will develop in the substrate can be diminished. On the other hand, by forming the transistors in advance, data density is assured (the ratios of field and gate data are assured) so as to avoid a situation in which formation of silicon cannot performed well in a case where the branched portion of the P+ diffusion layer 7, the branched portion of the N+ diffusion layer 8 and the gate electrodes 15c, 15d are left and there are very many or very few transistors on the chip. Alternatively, by forming the transistors in advance, it is possible for the transistors to be utilized also as repair transistors in post-treatment.

Figure 10:
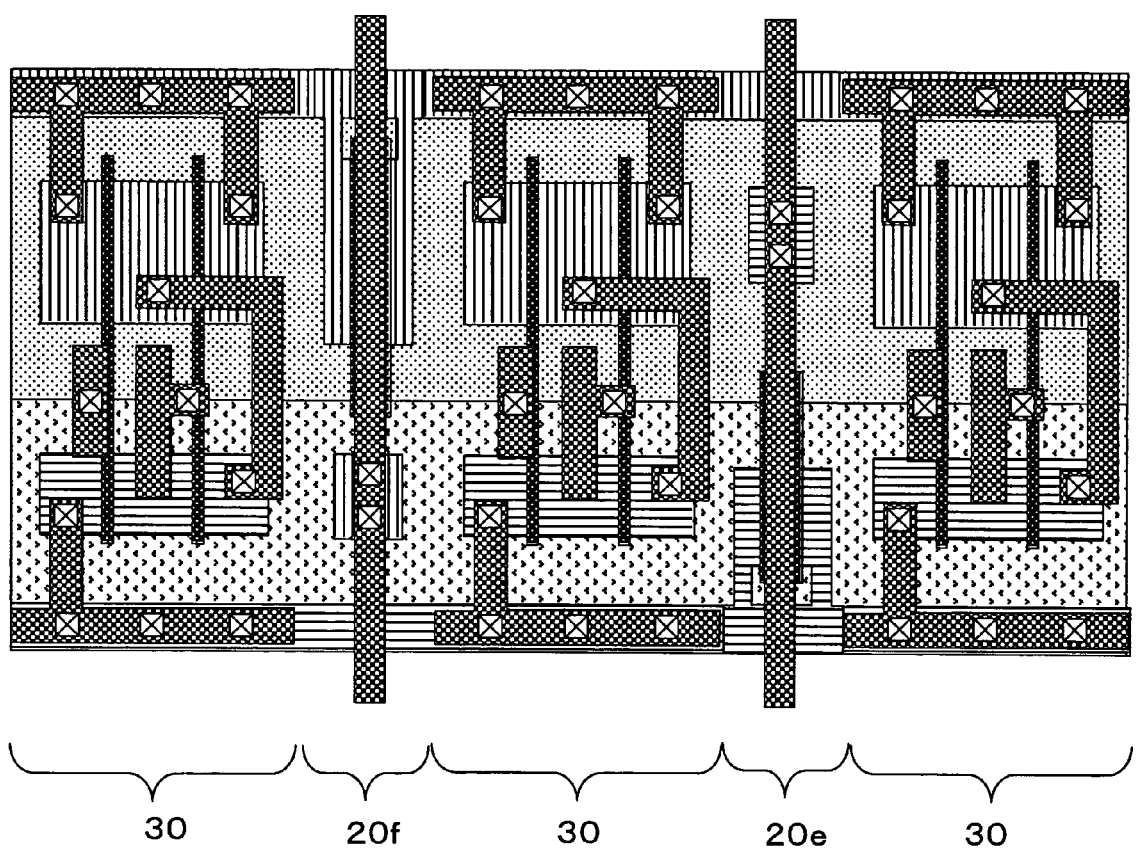
FIG. 10 is a plan view illustrating the partial structure of a semiconductor integrated circuit device according to the fourth embodiment.

FIG. 10 is a plan view illustrating the partial structure of the semiconductor integrated circuit device according to the fourth embodiment. The semiconductor integrated circuit device in FIG. 10 has the substrate-bias supply cells 20e, 20f and the standard cells 30 arranged in a row in the horizontal direction in FIG. 10 astride the N-well 2 and P-well 4. In the semiconductor integrated circuit device of FIG. 10, the substrate-bias supply cells 20e, 20f are substituted for the substrate-bias supply cells 20a, 20b, respectively, in FIG. 6. The semiconductor integrated circuit device thus constructed has effects similar to those of the second embodiment and also assures data density so as to avoid a situation in which formation of silicon cannot performed well.

In the semiconductor integrated circuit devices of FIGS. 6, 8 and 10 described above, it is possible for the substrate-bias supply cells 20a, 20c and 20e to be interchanged and for the substrate-bias supply cells 20b, 20d and 20f to be interchanged. That is, the substrate-bias supply cells in the second, third and fourth embodiments can be combined freely and placed on the substrate in accordance with the objective. Further, combined cells may be placed side by side in the manner illustrated in the first embodiment.

The first to fourth embodiments set forth above have been described mainly with regard to metal wiring of the lowermost layer of a semiconductor integrated circuit device and routing in the diffusion layer in a substrate-bias supply cell. Metal wiring in a higher level will be described next.

Figure 11:
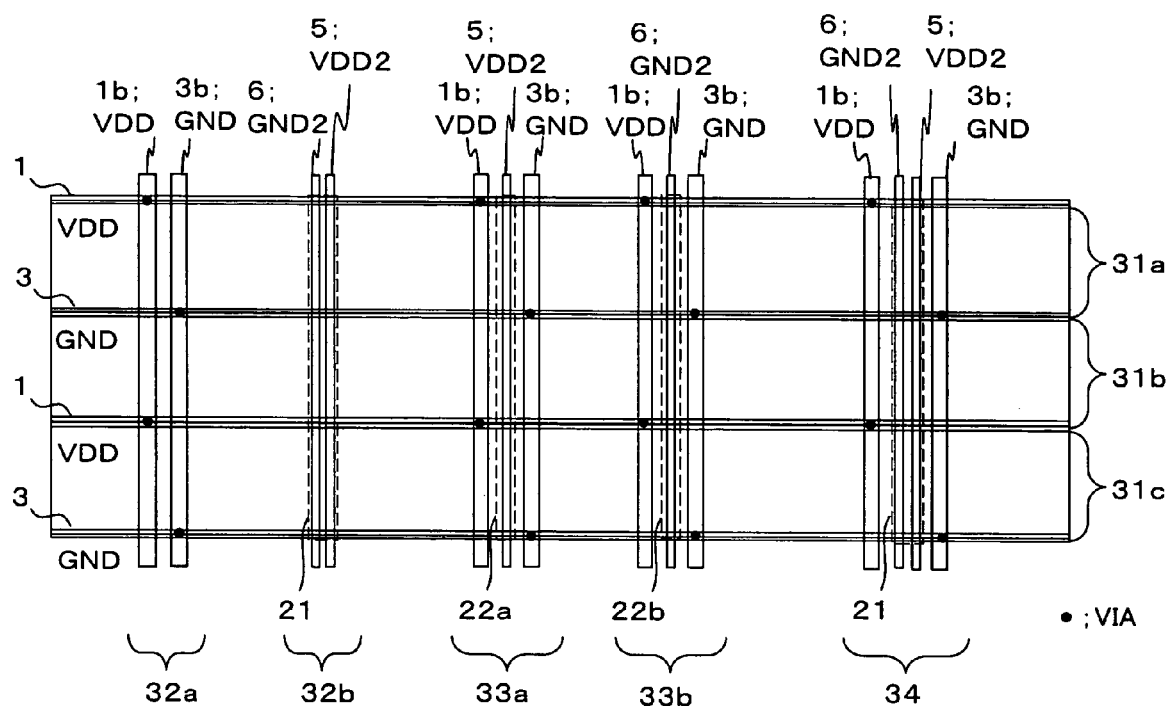
FIG. 11 is a plan view illustrating a partial structure relating to metal wiring of a semiconductor integrated circuit device.

FIG. 11 is a plan view illustrating a partial structure relating to metal wiring of a semiconductor integrated circuit device. As shown in FIG. 11, cell placement areas 31a, 31b and 31c are areas in which the standard cells 30 and substrate-bias supply cells are placed. The VDD wiring trace 1 or GND wiring trace 3 is placed horizontally between the cell placement areas 31a, 31b and 31c in the lowermost layer. Further, substrate-bias supply cells are placed in a cell placement area 21 for substrate-bias supply of an area 32b, a cell placement area 22a for substrate-bias supply of an area 33a, a cell placement area 22b for substrate-bias supply of an area 33b and a cell placement area 21 for substrate-bias supply of an area 34, and the substrate-bias VDD2 wiring traces 5 or substrate-bias GND2 wiring traces 6 are routed vertically in the lowermost layer.

By way of example, the substrate-bias supply cell 20 or a combination of cells made up of one selected from among the substrate-bias supply cells 20a, 20c, 20e and one selected from among the substrate-bias supply cells 20b, 20d, 20e is placed in the cell placement area 21. Further, by way of example, one cell selected from among the substrate-bias supply cells 20a, 20c, 20e is placed in the cell placement area 22a for supplying the substrate bias. Furthermore, by way of example, one cell selected from among the substrate-bias supply cells 20b, 20d, 20f is placed in the cell placement area 22b for supplying the substrate bias.

A wiring trace 1b and a GND wiring trace 3b are routed as pairs in the vertical direction in a metal layer that higher than the areas 32a, 33a, 33b, 34. Each wiring trace 1b is connected to the wiring traces 1b through vias (through-holes). Further, each GND wiring trace 3b is connected to the GND wiring traces 3 through vias (through-holes).

In the. semiconductor integrated circuit device having the structure set forth above, the supply of potential to the VDD wiring trace 1 as the horizontal metal wiring of the lowermost layer is from the wiring trace 1b, which is the metal wiring in the vertical direction. The supply of potential to the GND wiring trace 3 is from the GND wiring trace 3b, which is the metal wiring in the vertical direction. Structurally, the cell placement areas 21, 22a and 22b for supplying the substrate bias are such that the VDD wiring trace 1 and GND wiring trace 3 are not routed and the diffusion layer assists in wiring. As a result, this arrangement is less susceptible to the effects of IR-Drop, etc.

Although the structure of FIG. 11 illustrates an example in which the areas 32a, 32b, 33a, 33b and 34 are arranged in a row, it will suffice to dispose only the combination of areas 32a and 32b, on the combination of areas 33a and 33b, or only the area 34. Furthermore, it may be so arranged that any of these areas are placed upon being combined suitably.

Fifth Embodiment

Figure 12:
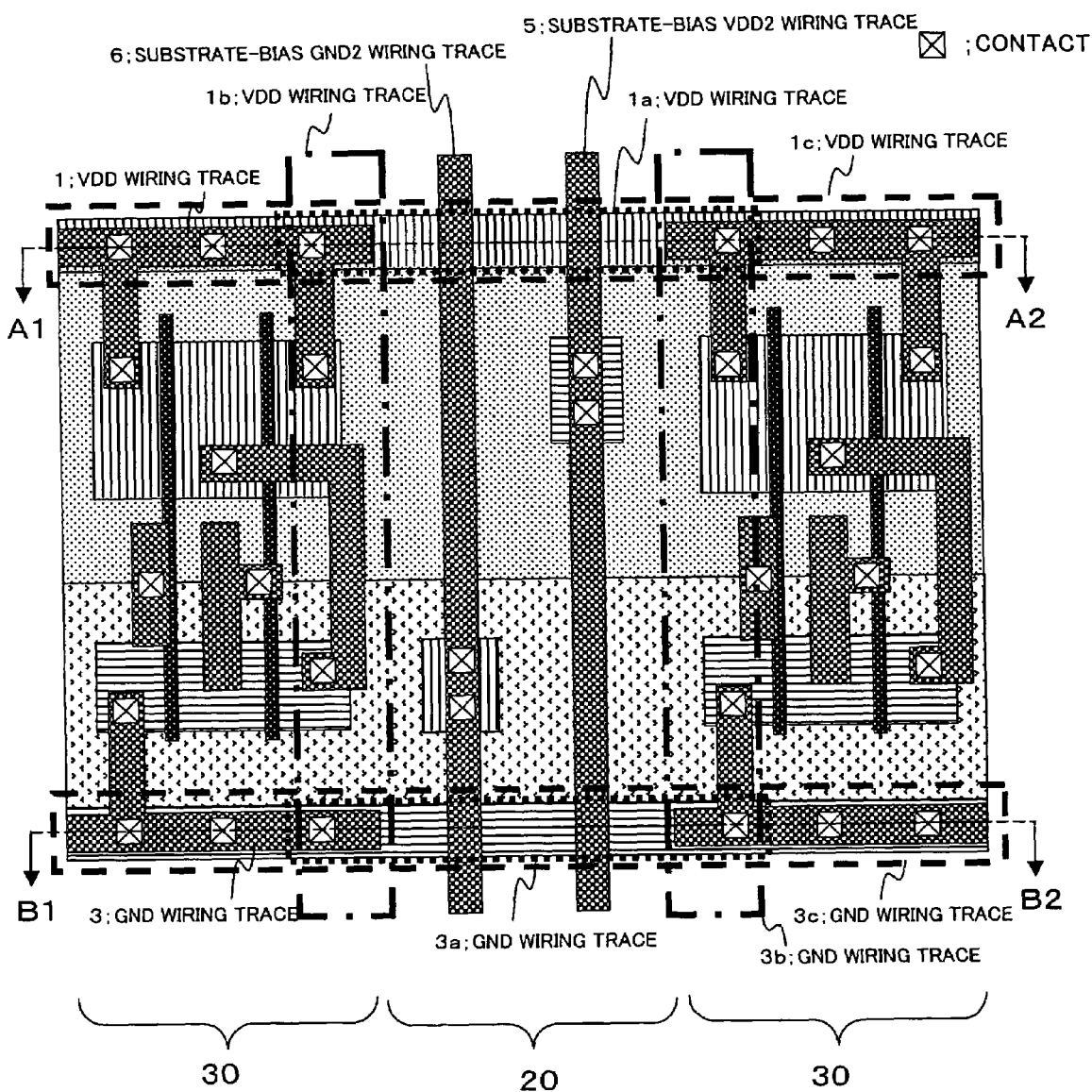
FIG. 12 is a plan view illustrating the partial structure of a semiconductor integrated circuit device according to a fifth embodiment according to the present invention.

FIG. 12 is a plan view illustrating the partial structure of a semiconductor integrated circuit device according to a fifth embodiment according to the present invention. The semiconductor integrated circuit device shown in FIG. 12 is obtained by further providing the semiconductor integrated circuit device of FIG. 2 with VDD wiring traces 1a, 1b, 1c and GND wiring traces 3a, 3b and 3c. The VDD wiring trace 1a and GND wiring trace 3a are routed horizontally in a higher metal layer on the substrate-bias supply cell 20. The VDD wiring trace 1b and GND wiring trace 3b are routed vertically in a higher metal layer. The VDD wiring trace 1c and GND wiring trace 3c are routed horizontally in a still higher metal layer.

Figure 13A:
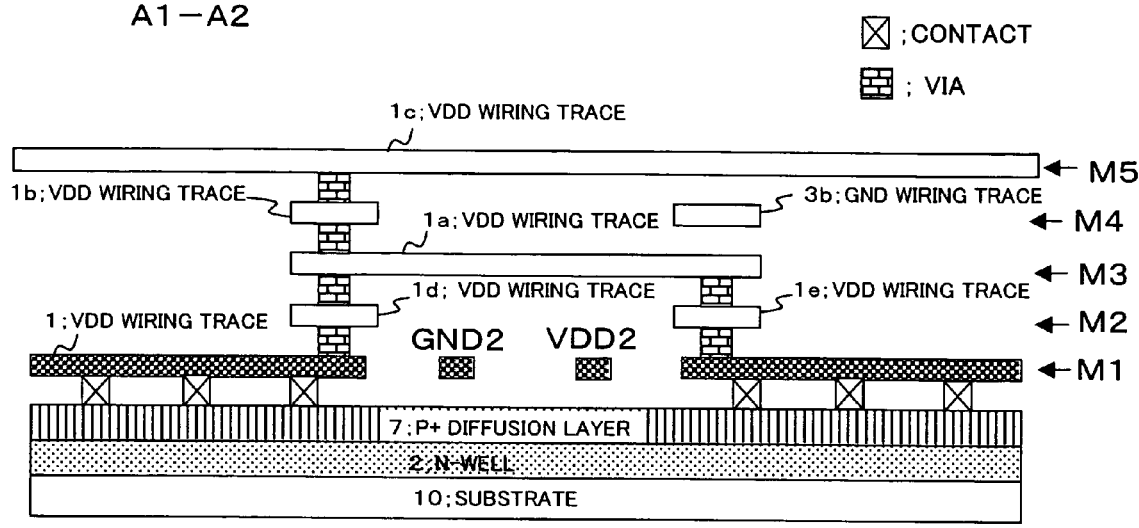
FIGS. 13A and 13B are sectional views illustrating the partial structure of a semiconductor integrated circuit device according to the fifth embodiment.

FIG. 13A is a sectional view taken along line A1-A2 of the semiconductor integrated circuit device shown in FIG. 12. As shown in FIG. 13A, the VDD wiring trace 1 is placed in a metal layer M1, which is the nearest wiring layer on the side of the substrate among wiring layers formed on the substrate, and is connected to the N+ diffusion layer 8 via contacts. Also placed in the metal layer M1 in the vertical direction are the substrate-bias VDD2 wiring trace 5 and substrate-bias GND2 wiring trace 6 on the substrate-bias supply cell 20 of FIG. 12. Placed in a metal layer M2, which is the second layer, are VDD wiring traces 1d, 1e, which are connected to the VDD wiring trace 1 through vias. The VDD wiring trace 1a is placed in a third metal layer M3 and is connected to the VDD wiring traces 1d, 1e in bridge-like fashion through vias. The VDD wiring trace 1b is placed in a fourth metal layer M4 and is connected to the VDD wiring trace 1a through a via. Further, the GND wiring trace 3b is routed in the fourth metal layer M4 in isolated fashion. It should be noted that the VDD wiring trace 1b and GND wiring trace 3b are wiring traces in the vertical direction in FIG. 12. The VDD wiring trace 1c is placed in a fifth metal layer MS and is connected to the VDD wiring trace 1b through a via.

Figure 13B:
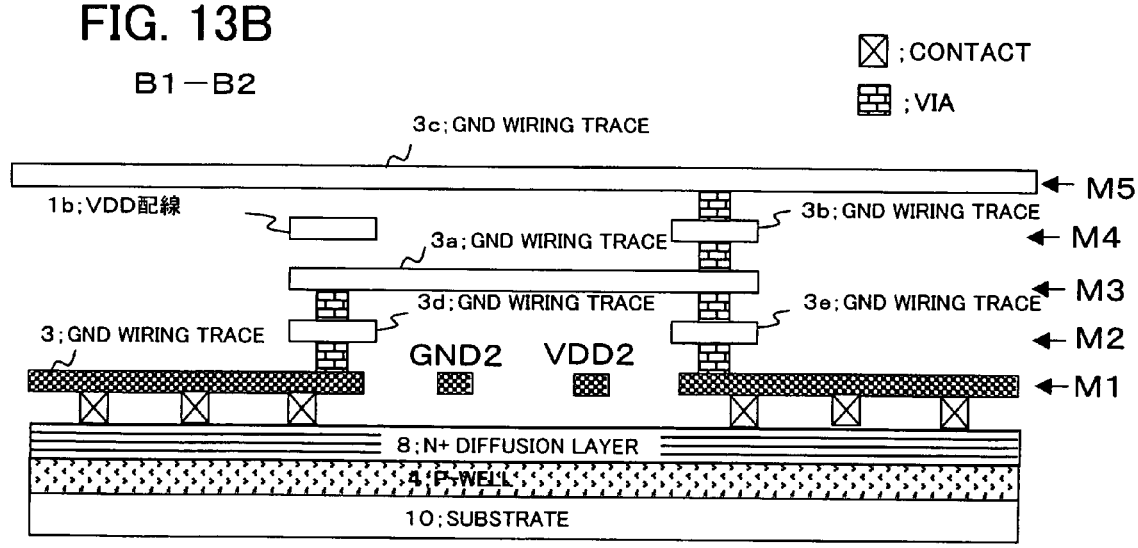

FIG. 13B is a sectional view taken along line B1-B2 of the semiconductor integrated circuit device shown in FIG. 12. As shown in FIG. 13B, the GND wiring trace 3 is placed in the metal layer M1, which is the nearest wiring layer on the side of the substrate among wiring layers formed on the substrate, and is connected to the N+ diffusion layer 8 via contacts. Also placed in the metal layer M1 in the vertical direction are the substrate-bias VDD2 wiring trace 5 and substrate-bias GND2 wiring trace 6 on the substrate-bias supply cell 20 of FIG. 12. Placed in the second metal layer M2 are GND wiring traces 3d, 3e, which are connected to the GND wiring trace 3 through vias. The GND wiring trace 3a is placed in the third metal layer M3 and is connected to the GND wiring traces 3d, 3e in bridge-like fashion through vias. The GND wiring trace 3b is placed in the fourth metal layer M4 and is connected to the GND wiring trace 3a through a via. Further, the VDD wiring trace 1b is routed in the fourth metal layer M4 in isolated fashion. The GND wiring trace 3c is placed in the fifth metal layer M5 and is connected to the GND wiring trace 3b through a via.

The semiconductor integrated circuit device having the structure set forth above is such that wiring having a bridge-like structure is formed in a higher metal layer in relation to the VDD wiring trace 1 and GND wiring trace 3 in which the wiring is severed on the substrate-bias supply cell 20. It is possible, therefore, to supply the VDD power supply and the GND ground potential using metal that has a higher degree of stability at all times. It should be noted that this structure is applicable to the first to fourth embodiments of the present invention.

Figure 14:
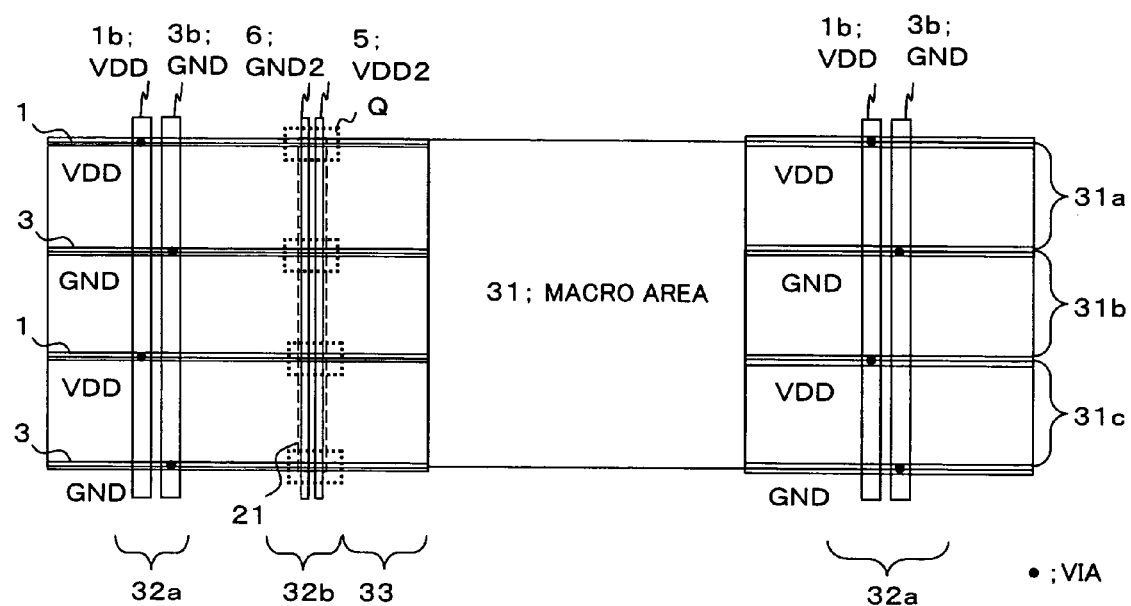
FIG. 14 is a plan view illustrating a partial structure relating to metal wiring of a semiconductor integrated circuit device having a macro area.

Described next will be an example in which the structure of FIGS. 12, 13A and 13B functions particularly effectively. FIG. 14 is a plan view illustrating a partial structure relating to metal wiring of a semiconductor integrated circuit device having a macro area. The semiconductor integrated circuit device shown in FIG. 14 is such that a macro area 31 spans the cell placement areas 31a, 31b, 31c at the central portion of the semiconductor integrated circuit shown in FIG. 11. The VDD wiring trace 1 and GND wiring trace 3 are severed by placement of the macro area 31 in this structure. Further, in the cell placement area 21 for supplying the substrate bias of area 32b, the VDD wiring trace 1 and GND wiring trace 3 are severed so that wiring assistance by the diffusion layer is all that takes place. Consequently, in the cell that exists in area 33 between the area 32b and the macro area 31, only supply of power by the diffusion layer is performed and, hence, there is the danger of a decline in the stability of supply of power. Accordingly, by forming the bridge-structure wiring with respect to the VDD wiring trace 1 or GND wiring trace 3 in the metal layer higher than an area Q in which the VDD wiring trace 1 or GND wiring trace 3 intersects the substrate-bias VDD2 wiring trace 5 and substrate-bias GND2 wiring trace 6, the supply of power to the cell that exists in the area 33 is performed in a stable manner. It should be noted that the VDD wiring traces 1b, 1c and GND wiring traces 3b, 3c shown in FIG. 12 are not particularly routed in the area 32b of FIG. 14. It does not matter if these wiring traces are added on when necessary.

Sixth Embodiment

Figure 15:
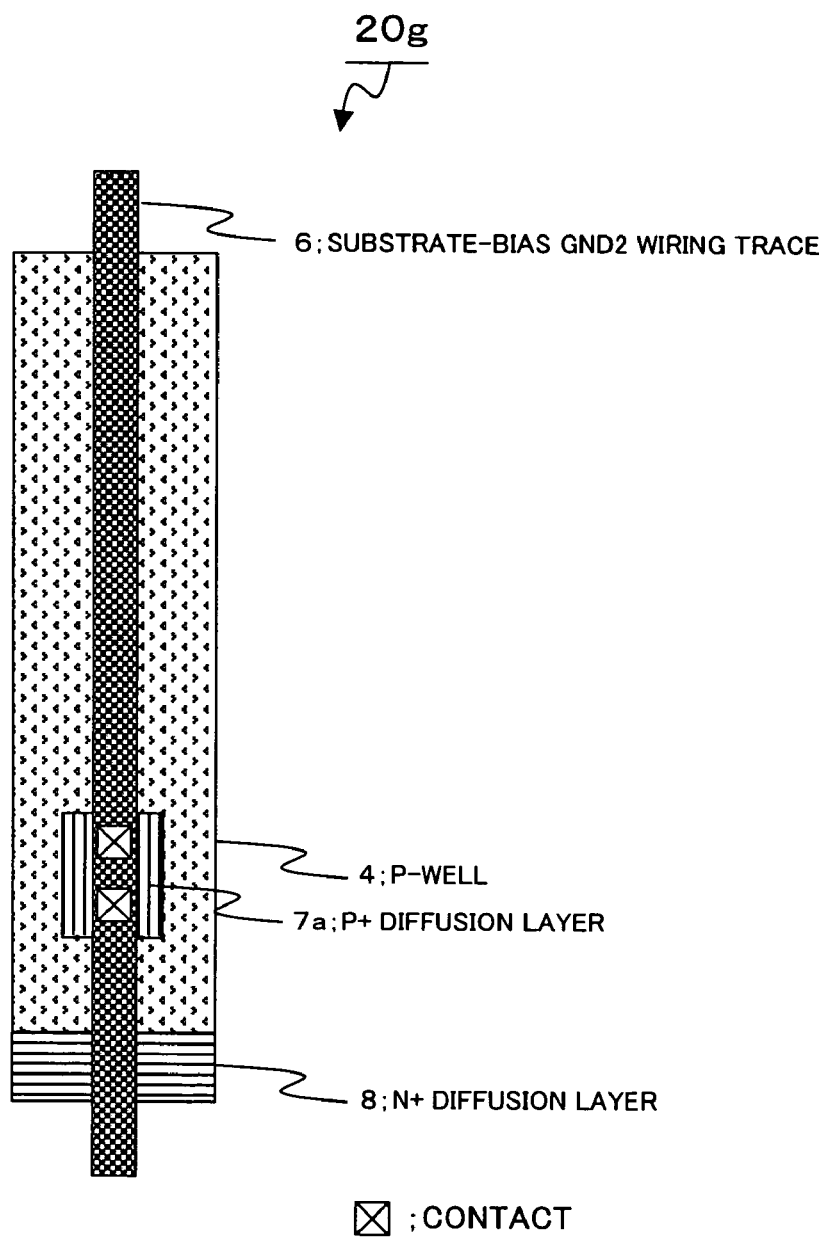
FIG. 15 is a plan view illustrating a substrate-bias supply cell according to a sixth embodiment of the present invention.

FIG. 15 is a plan view illustrating a substrate-bias supply cell according to a sixth embodiment of the present invention. A substrate-bias supply cell 20g in FIG. 15 is for supplying the ground potential of the substrate-bias GND2. This cell is obtained by eliminating the N-well 2 and P+ diffusion layer 7 from the substrate-bias supply cell 20b of FIG. 5B and disposing the P-well 4 over the entire surface instead.

Figure 16A:
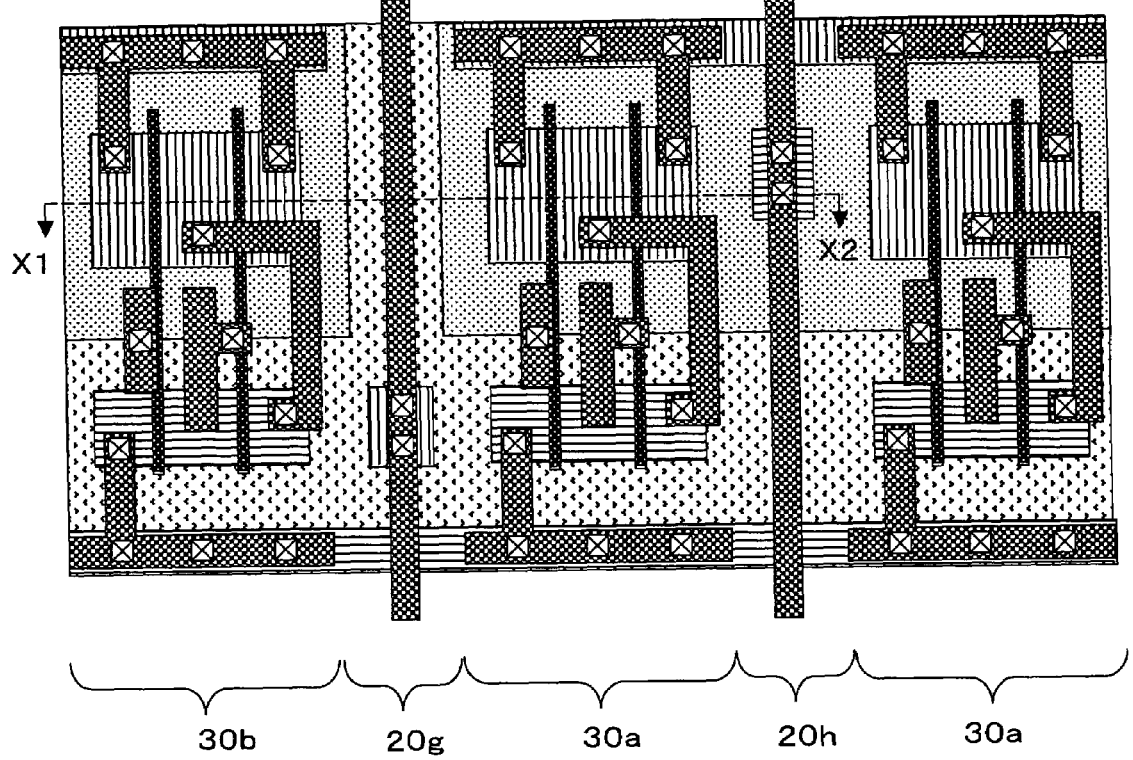
FIGS. 16A and 16B are plan and sectional views, respectively, illustrating the partial structure of a semiconductor integrated circuit device according to a sixth embodiment of the present invention.
Figure 16B:
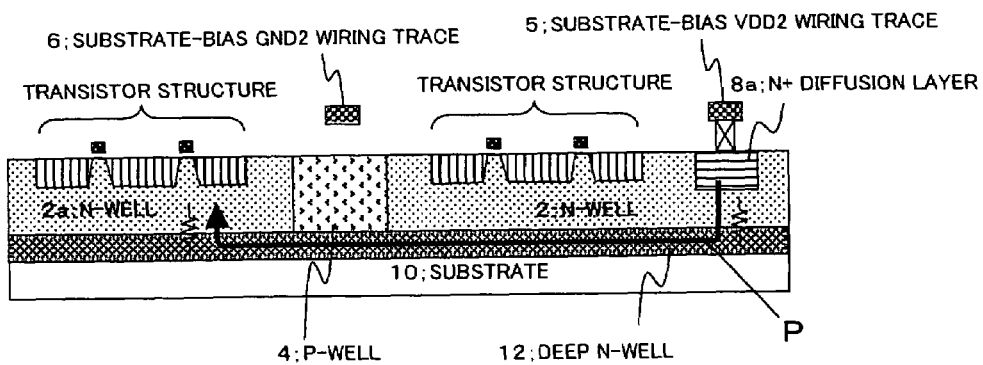

FIG. 16A is a plan view illustrating the partial structure of a semiconductor integrated circuit device according to the sixth embodiment of the present invention. As shown in FIG. 16A, the semiconductor integrated circuit device has substrate-bias supply cells 20g, 20h and standard cells 30a, 30b. Among the multiplicity of cells that exist in the semiconductor integrated circuit device in FIG. 16A, three standard cells 30a, 30a, 30b, the substrate-bias supply cell 20h bracketed by the two standard cells 30a at the right and center, and the substrate-bias supply cell 20g bracketed by the two standard cells 30a, 30b at the left and center are illustrated. FIG. 16B is a sectional view taken along line X1-X2 of the semiconductor integrated circuit device in FIG. 16A. As shown in FIG. 16B, a deep N-well 12 is placed on the substrate 10, and N-wells 2, 2a and P-well 4 are placed on the deep N-well 12. It should be noted that in the standard cells and substrate-bias supply cells described in the first to fifth embodiments, the deep N-well generally is placed in the lower portion, although this is not clearly indicated. What is clearly shown here is that the deep N-well 12 is placed in the lower portion of the standard cells 30a, 30b and substrate-bias supply cells 20g, 20h. Essentially, the standard cells 30a, 30b have a structure similar to that of the standard cell 30 and the substrate-bias supply cell 20h has a structure similar to that of the substrate-bias supply cell 20a.

In the semiconductor integrated circuit device having the structure set forth above, the bias voltage of the substrate-bias VDD2 wiring trace 5 is supplied as back-gate bias in the transistor of the standard cell 30b via a path P formed by a contact, the N+ diffusion layer 8a, N-well 2, deep N-well 12 and N-well 2a, as illustrated in FIG. 16B. That is, even though the N-well 2 and N-well 2a are cut off from each other by the P-well 4, the deep N-well 12 functions to supply the bias voltage between the N-wells. The P-well 4, on the other hand, exists in the form of a mesh surrounding the N-wells. This will be described next.

Figure 17:
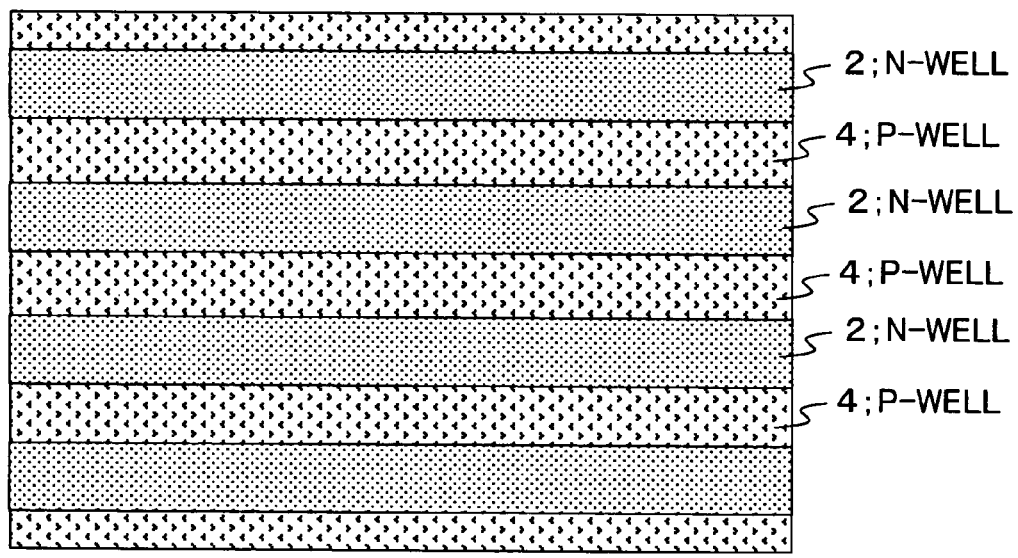
FIG. 17 is a diagram illustrating the wiring structure of P- and N-wells of the semiconductor integrated circuit devices according to the first to fifth embodiments.
Figure 18:
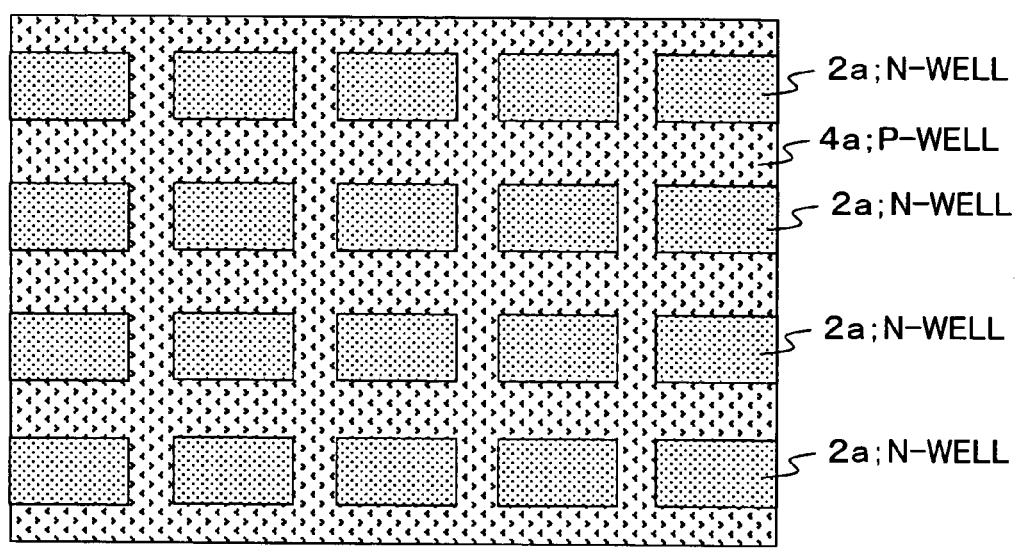
FIG. 18 is a diagram illustrating the wiring structure of P- and N-wells of the semiconductor integrated circuit device according to the sixth embodiment.
Figure 19:
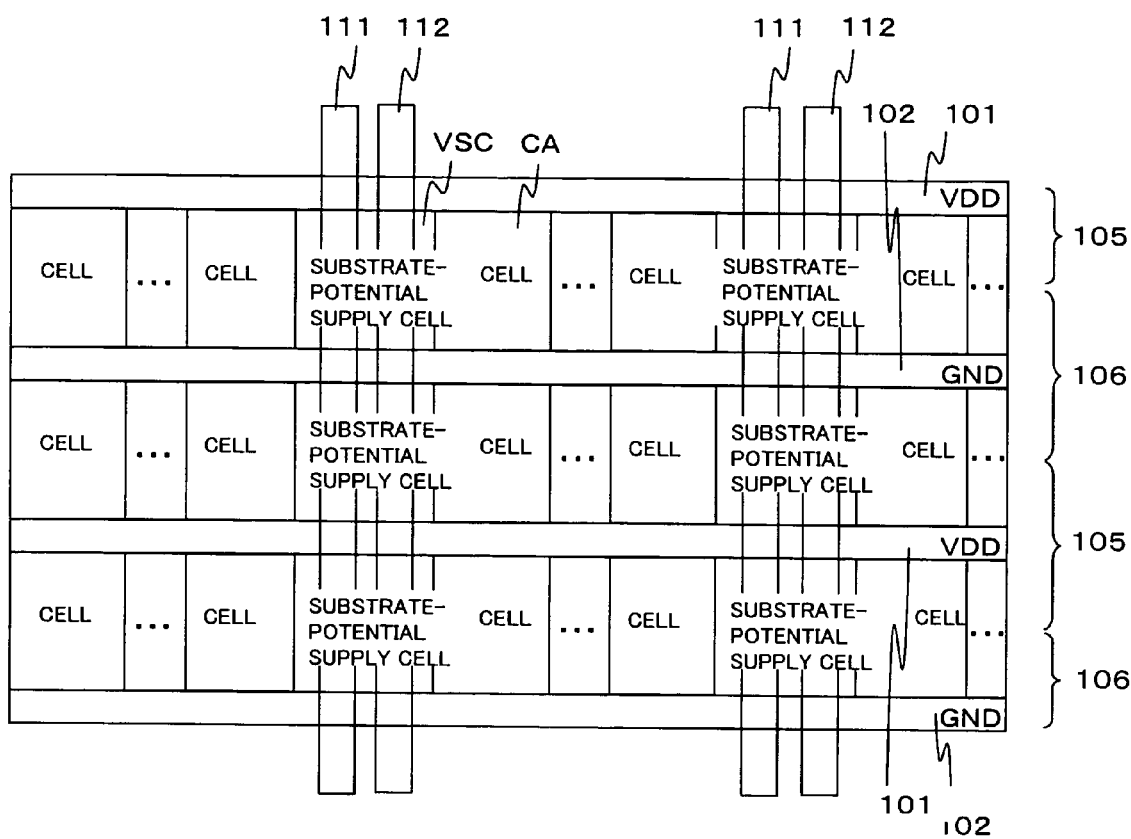
FIG. 19 is a diagram illustrating the wiring structure of a semiconductor integrated circuit device according to the prior art.

FIG. 17 is a diagram illustrating the wiring structure of P- and N-wells of the semiconductor integrated circuit devices according to the first to fifth embodiments. As shown in FIG. 17, the P-well 4 and N-well 2 are disposed alternatingly in the form of bands along the cell placement area. By contrast, in the semiconductor integrated circuit device according to the sixth embodiment, as illustrated in FIG. 18, the placement structure of the P- and N-wells comprises the N-wells 2a disposed in isolated fashion (in the form of islands), and a P-well 4a surrounding the N-wells 2a in the form of a mesh (a "sea" surrounding the "islands").

In the semiconductor integrated circuit device having this structure, the substrate bias VDD2 is supplied to each N-well 2a via the deep N-well 12, as mentioned earlier, and the substrate bias GND2 is supplied by the P-well 4a arranged in mesh form. Accordingly, both the N-wells 2a and P-well 4a are supplied with sufficient voltage.

The semiconductor integrated circuit device according to the sixth embodiment set forth above comprises: a plurality of first well regions formed as islands in a substrate, a second well region formed in the manner of a sea in the substrate so as to surround the plurality of first well regions, and a third well region of the same conductivity type as that of the first well region formed in the substrate below the first and second wells; wherein the power supply for the first substrate-bias supply to be supplied to some of the plurality of first well regions is supplied to the other first well regions using the third well region as a wiring route, and the power supply for the second substrate-bias supply is supplied using the second well region.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
a first wiring trace routed along a well of a first conductivity type in a substrate;

a second wiring trace routed along a well of a second conductivity type in the substrate;

a third wiring trace disposed in the same layer as said first and second wiring traces, routed in a direction that intersects said first and second wiring traces and electrically insulated from said first and second wiring traces;

a first diffusion layer of the second conductivity type disposed in the well of the first conductivity type in the vicinity of a portion where the wiring directions of said first and third wiring traces intersect, and electrically connected to said first wiring trace through a contact; and a second diffusion layer of the first conductivity type disposed in the well of the second conductivity type in the vicinity of a portion where the wiring directions of said second and third wiring traces intersect, and electrically connected to said second wiring trace through a contact;

wherein said first diffusion layer is used as a wiring route regarding said first wiring trace, and said second diffusion layer is used as a wiring route regarding said second wiring trace.

2. The device according to claim 1, further comprising a fourth wiring trace disposed in the same layer as that of said first and second wiring traces, routed in a direction that intersects said first and second wiring traces, electrically insulated from said first and second wiring traces and spaced a prescribed distance away from said third wiring trace;

wherein in the vicinity of a portion where the wiring directions of said first and fourth wiring traces intersect, said first diffusion layer is electrically connected to said first wiring trace through a contact and is used as a wiring route regarding said first wiring trace; and in the vicinity of a portion where the wiring directions of said second and fourth wiring traces intersect, said second diffusion layer is electrically connected to said second wiring trace through a contact and is used as a wiring route regarding said second wiring trace.

3. The device according to claim 2, wherein said first and second wiring traces are formed in a wiring layer closest to the side of the substrate among wiring layers formed on said substrate.

4. The device according to claim 1, wherein said first and second wiring traces are formed in a wiring layer closest to the side of the substrate among wiring layers formed on said substrate.

5. A semiconductor integrated circuit device that includes cell placement areas in which a plurality of standard cells are placed on a semiconductor substrate, said device comprising:

a first power-supply line for supplying a first power-supply potential to the standard cells;

a second power-supply line, which is routed parallel to said first power-supply line, for supplying a second power-supply potential to the standard cells;

a third power-supply line, which is routed in a direction that intersects said first power-supply line, for supplying a third power-supply potential to a well of a first conductivity type in the cell placement areas;

a fourth power-supply line, which is routed parallel to said third power-supply line, for supplying a fourth power-supply potential to a well of a second conductivity type in the cell placement areas;

first and second substrate-bias supply cells disposed in the cell placement areas;

a first diffusion layer of the second conductivity type disposed in the well of the first conductivity type and electrically connected to said first power-supply line through a contact; and a second diffusion layer of the first conductivity type disposed in the well of the second conductivity type and electrically connected to said second power-supply line through a contact;

wherein said first, second, third and fourth power-supply lines are formed in a first metal wiring layer of said semiconductor integrated circuit device;

said first substrate-bias supply cell includes:
said third power-supply line;
a first well contact connected to said third power-supply line for supplying the third power-supply potential to the well of the first conductivity type;
said first diffusion layer; and
said second diffusion layer;

said second substrate-bias supply cell includes:
said fourth power-supply line;
a second well contact connected to said fourth power-supply line for supplying the fourth power-supply potential to the well of the second conductivity type;
said first diffusion layer; and
said second diffusion layer; and in said first and second substrate bias supply cells, said first diffusion layer is used as a wiring route regarding said first power-supply line and said second diffusion layer is used as a wiring route regarding said second power-supply line.

6. The device according to claim 5, wherein the first metal wiring layer is a wiring layer formed in a wiring layer closest to the side of the substrate among wiring layers formed on said substrate.

7. The device according to claim 6, wherein in said first and second substrate-bias supply cells, said first and second power-supply lines are routed so as to detour around the second metal wiring layer.

8. The device according to claim 7, wherein said first substrate-bias supply cell has a first MOS transistor in which parts of said second diffusion layer are formed as a source and drain.

9. The device according to claim 8, wherein a gate electrode of said first MOS transistor is connected to said third power-supply line through a via or is floating.

10. The device according to claim 7, wherein said second substrate-bias supply cell has a second MOS transistor in which parts of said first diffusion layer are formed as a source and drain.

11. The device according to claim 5, wherein said first substrate-bias supply cell has a first MOS transistor in which parts of said second diffusion layer are formed as a source and drain.

12. The device according to claim 11, wherein a gate electrode of said first MOS transistor is connected to said third power-supply line through a via or is floating.

13. The device according to claim 11, wherein said second substrate-bias supply cell has a second MOS transistor in which parts of said first diffusion layer are formed as a source and drain.

14. The device according to claim 5, wherein said second substrate-bias supply cell has a second MOS transistor in which parts of said first diffusion layer are formed as a source and drain.

15. The device according to claim 14, wherein a gate electrode of said second MOS transistor is connected to said fourth power-supply line through a via or is floating.

16. The device according to claim 14, wherein said first and second MOS transistors function as capacitance elements provided between a short-circuited source and drain and a gate electrode.

17. The device according to claim 5, wherein said first and second substrate-bias supply cells are arranged side by side as a pair.

* * * * *